United States Patent [19]
Thietje

[11] Patent Number: 5,468,302
[45] Date of Patent: Nov. 21, 1995

[54] SEMICONDUCTOR WAFER CLEANING SYSTEM

[76] Inventor: Jerry Thietje, 2223 Bruynswick Rd., Wallkill, N.Y. 12589

[21] Appl. No.: 274,250

[22] Filed: Jul. 13, 1994

[51] Int. Cl.⁶ ............................................. B08B 3/02
[52] U.S. Cl. .................. 134/1; 134/33; 134/153
[58] Field of Search .................. 134/1, 2, 33, 151, 134/153, 144, 148

[56] References Cited

U.S. PATENT DOCUMENTS

| | | | |
|---|---|---|---|
| 3,970,471 | 7/1976 | Bankes et al. | 134/33 |
| 5,203,360 | 4/1993 | Nguyen et al. | 134/153 |
| 5,279,316 | 1/1994 | Miranda | 134/1 |
| 5,320,706 | 6/1994 | Blackwell | 134/33 |
| 5,368,054 | 11/1994 | Koretsky et al. | 134/153 |

*Primary Examiner*—Scott Kastler
*Attorney, Agent, or Firm*—Helfgott & Karas

[57] ABSTRACT

A semiconductor wafer high purity cleaning apparatus for cleaning large semiconductor wafers of 200 mm in diameter and is intended for circuitry in small geometric structures of 0.3 Microns or less. The apparatus includes successively arranged wafer loading, washing, drying and unloading stations, each having an individual closable enclosure. Also included in the apparatus is a device for storing a number of wafers in a vertical plane within the enclosures of the loading and unloading stations, a device for transporting a sequence of individual wafers, a device for rotating the wafers and a high pressure jet for simultaneously cleaning opposite surfaces of the wafers.

12 Claims, 6 Drawing Sheets

SEMICONDUCTOR WAFER CLEANING SYSTEM

FIELD OF THE INVENTION

This invention relates to semiconductor wafer cleaning systems, and more particularly to a cleaning system for large semiconductor wafers of 200 mm in diameter and is intended for circuitry in small geometric structures of 0.3 Micron or less.

BACKGROUND OF THE INVENTION

The problems of cleaning delicate semiconductor wafer surfaces to near absolute cleanliness are so great that the usual cleaning methods and apparatus involving brushes or combinations of brushes and pressure rinse cleaning produce intolerable particle contamination and breakage of the wafer. In addition, the particle contamination associated with exposure of the wafer to an ambient environment has heretofore been deemed to require that the wafer remain within a single particle free enclosure during at least the washing, rinsing and drying stages. Moreover, the usual type of assembly-line multistage cleaning methods and apparatus used for more rugged apparatus, such as computer hard disks, which do not require such near-absolute cleanliness do not provide the requisite safeguards against particle contamination or breakage; and therefore have not heretofore been deemed practical for use with semiconductor wafers.

SUMMARY OF THE INVENTION

Accordingly, one important general object of the invention is to provide an automated assembly-line multistation type semiconductor wafer cleaning apparatus capable of achieving near absolute cleanliness with virtually no breakage.

It is another object of the invention to provide a system able to clean a 200 mm wafer to less than 10 particles of 0.3 microns in diameter or larger.

Another object of the invention is to provide a system which will clean both sides of a wafer simultaneously on a single pass through the system.

A further object of the invention is to provide a cleaning system wherein the cleaning quality and wafer breakage will be independent of wafer warping that does not exceed plus or minus 200 micron.

A still further object of the invention is to provide a system wherein cleaning quality is independent of batch size.

A yet further object of the invention is to provide a system which does not scratch, damage or contaminate the wafer with organic, metallic, ionic or other particulate.

Still another object of the invention is to provide a system which does not create edge damage visible under 10× magnification.

Yet another object of the invention is to provide a system which will clean 1000 wafers without breakage.

An additional object of the invention is to provide a system which is simple and inexpensive of manufacture and maintenance, and easy of use.

The objects of the invention are accomplished by a system having a processing unit which cleans semiconductor wafers by transporting them between individual closable enclosures, while holding them in the Vertical Plane. The processing unit includes a cleaning module employing high pressure and ultrasonic spray nozzles, a spin/dry module employing a dual conical capture ring exhaust. Cassette load and unload modules from which and to which two wafer handling robotic devices empty and supply wafers in turn, and adapt the system for external computer control.

BRIEF DESCRIPTION OF THE DRAWINGS

These and other objects, features and advantages of the invention will become apparent from a reading of the following description of a preferred embodiment of the invention, when considered with the appended drawings wherein.

DETAILED DESCRIPTION OF A PREFERRED EMBODIMENT OF THE INVENTION

Figure 1:
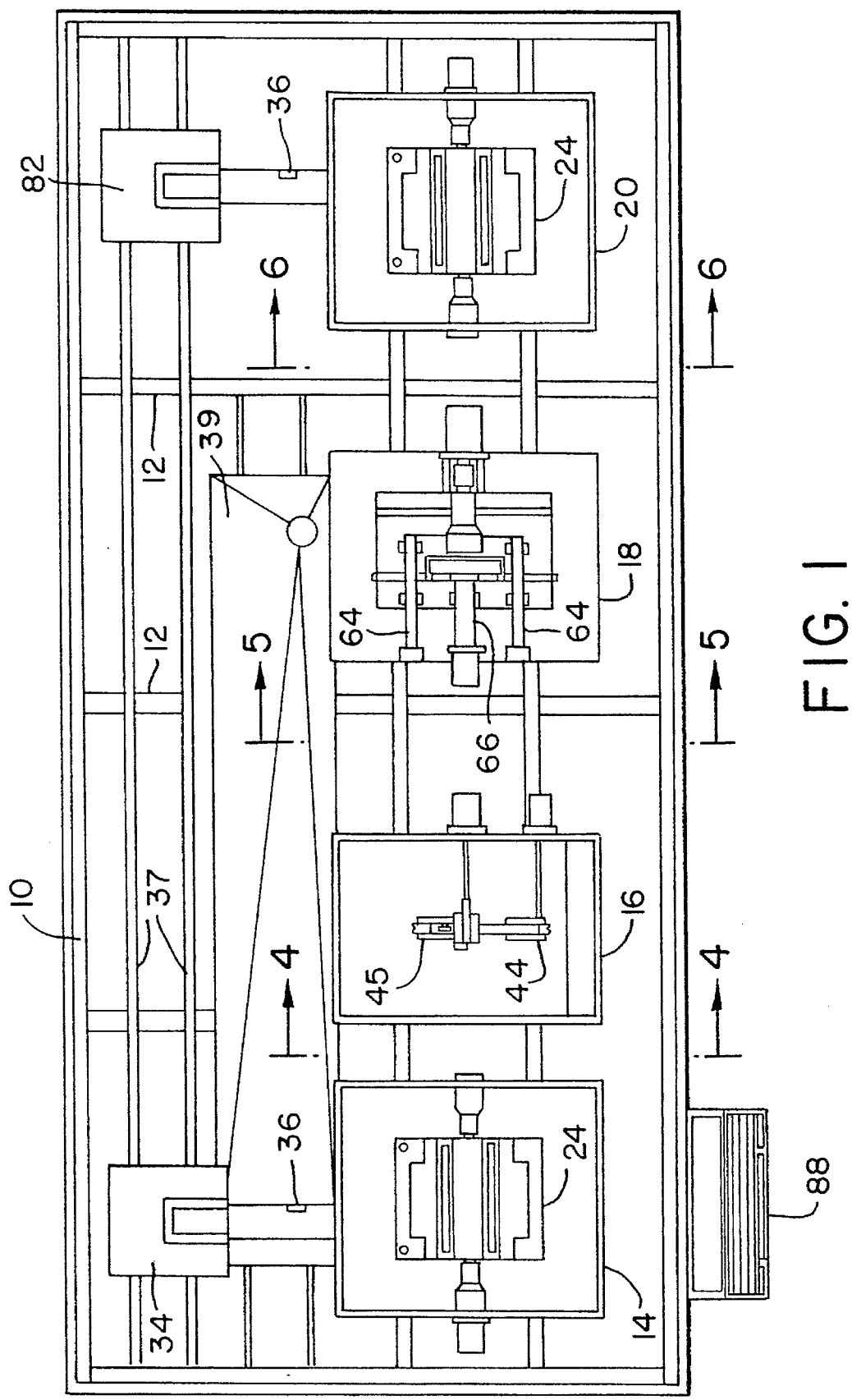
FIG. 1 is a top elevational view of the processing unit and of the system lap top computer for controlling the processing unit.
Figure 2:
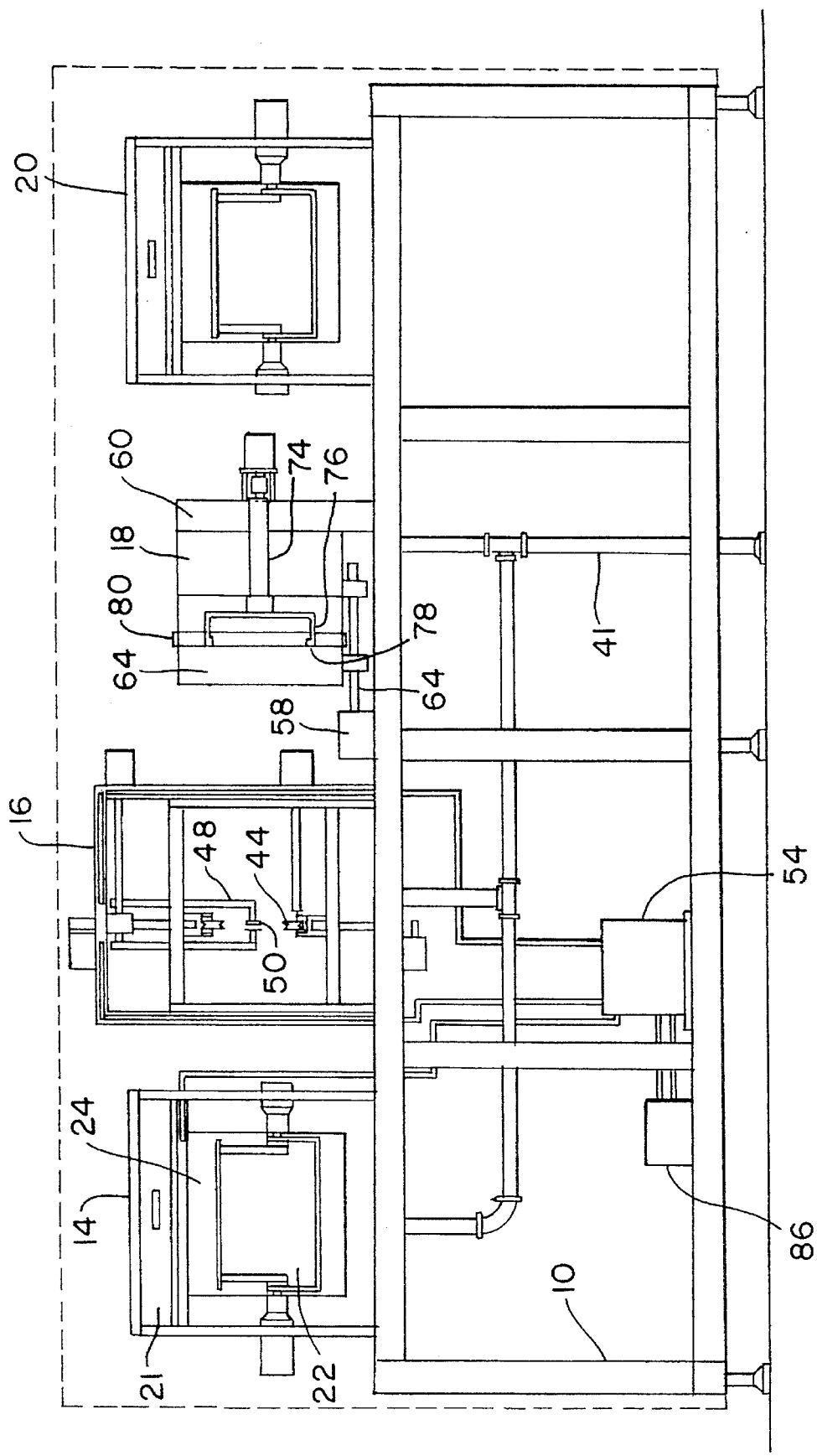
FIG. 2 is a back elevational view of the processing unit.

Referring now to the drawings and more particularly to FIG. 1 and FIG. 2 thereof, the system processing unit is shown as including a frame (10) of conventional construction. It supports the various modules and robotics units at work station heights. Thus it supports, on intermediate bars (12), and from left to right, a wafer cassette loading module generally indicated by the numeral (14), a high pressure cleaning module generally indicated by the numeral (16), a spin/dry module generally indicated by the numeral (18), and a wafer cassette unloading module generally indicated by the numeral (20). The wafer cassette unloading module (20) is essentially identical with the wafer cassette loading module (14).

The wafer cassette loading module (14) is of standard construction. It includes an enclosure of high purity polished 316L stainless steel having a front opening (22) when a shield (23 not shown) is moved, for the removal of a wafer and for the placement of a standard Teflon or polyurethane cassette therein on the rails of the cassette holder, generally indicated by the numeral (24), manufactured of high purity polished 316L stainless steel. The cassette full of wafers is placed within the enclosure through the opening (21) of the enclosure so that the wafers are in the Vertical Plane. A corrosion resistant encapsulated sensor (not shown) detects when a cassette has been positioned within the rails of the holder (24) and causes the cassette holder to rotate, through the use of a precision rotary actuator whose rod size has been matched end to end so as to ensure the precise movement to its set position with 100% accuracy, thus facilitating the removal of individual wafers. The shield (23 not shown) closes when the cassette is in the process position. When full closure has occurred a laser sensor will verify and then signal a valve to turn on deionized water via nozzles (28) so as to continually wet and pre-rinse the wafers (see FIG. 3). The floor of the module is beveled for connection to a tube (26 FIG. 3) which drains away the deionized water used to pre-rinse the wafers of any large surface particulate and keep them wet and emanating from nozzles (28) connected to a suitable supply via tube (30).

Figure 3:
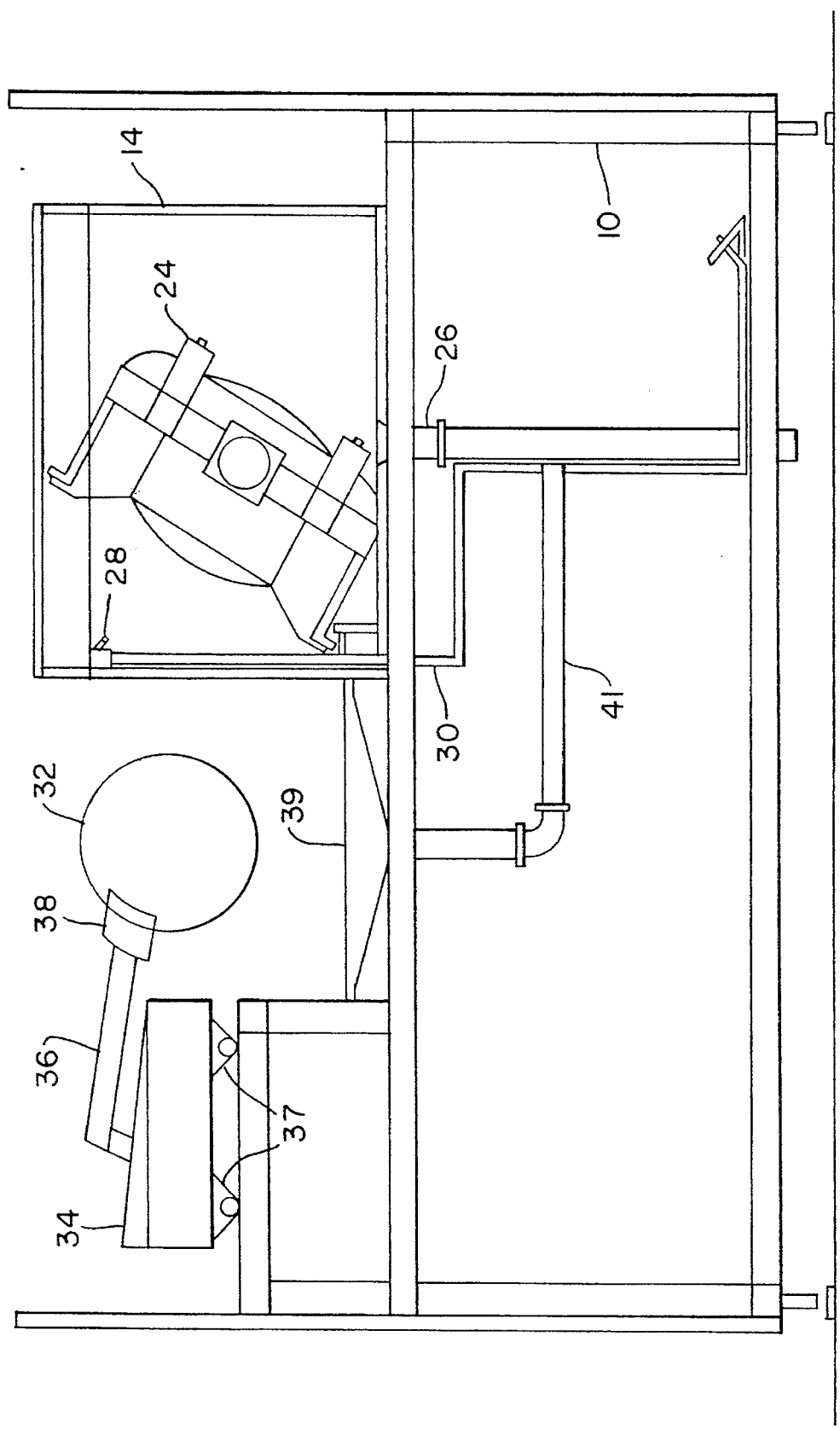
FIG. 3 is a side elevational view of the unit of FIG. 1 and showing details of the wafer cassette loading module.

A wafer (32) is removed from the wafer cassette loading module (14) by a microprocessor controlled wafer handling robotic device (34). As best seen in FIG. 3, the wafer handling robotics device (34) has an extension arm (36) which can extend into module (14) through opening (22) to seize the next wafer in line by the use of its pads (38) and thereby extract the wafer from the module.

When the wafer handling robotics device (34) verifies that it has arrived at its programmed position, it sends a signal to shut off the water flow to nozzles (28) and open the shield (23 not shown) to allow the arm (36) to extend and retrieve the next wafer in the process. When the wafer has been verified that it is secure within the pads (38) the wafer handling robotics device (34) will then retract its arm (36), send a signal to close the shield and restart the water flow from nozzles (28).

Figure 4:
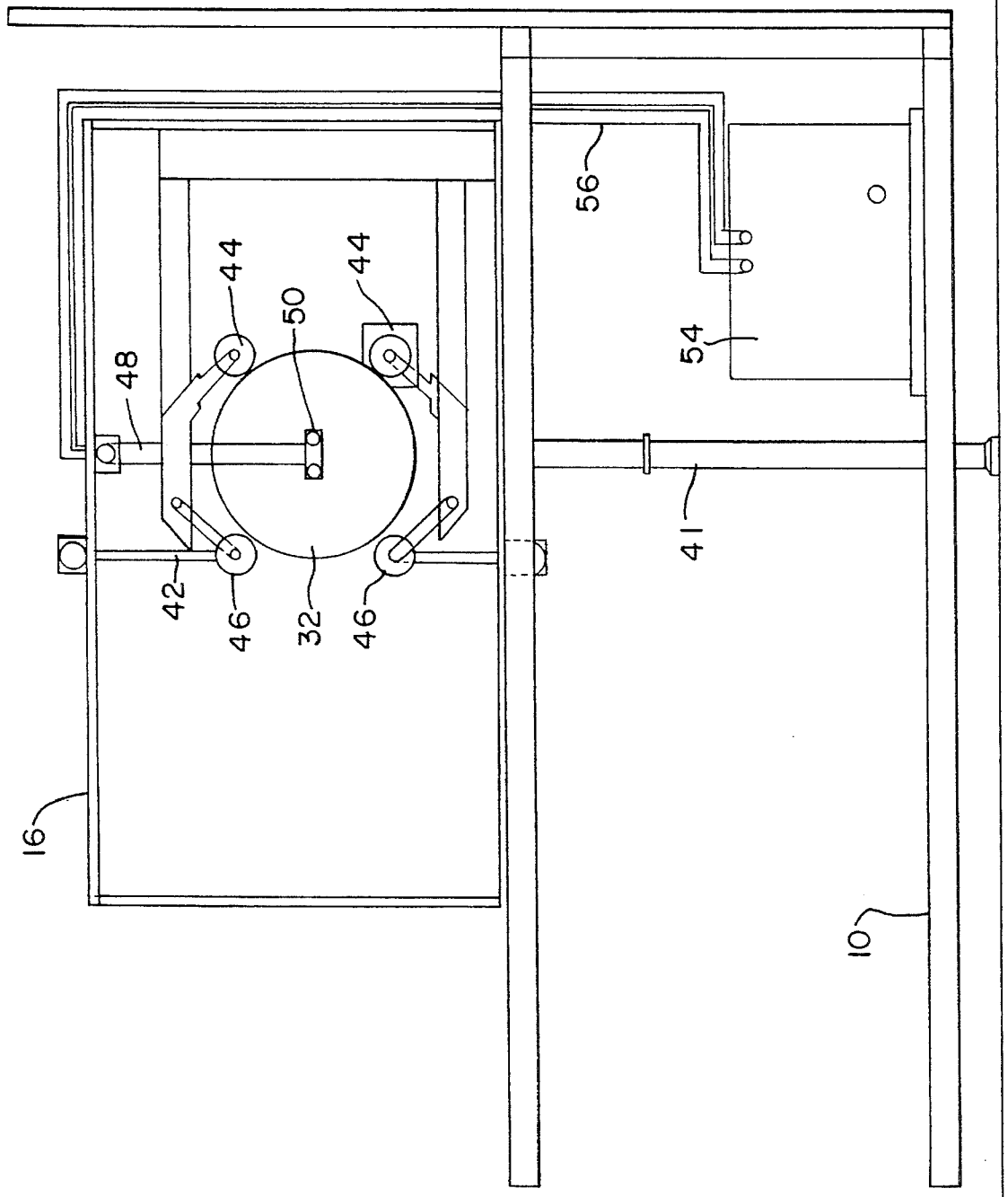
FIG. 4 is a sectional view taken along the line number 4 of FIG. 1 and showing details of the high pressure cleaning module.

After the wafer handling robotics device (34) has removed a wafer from the unload module (14) and verified retraction, it starts to travel toward the high pressure cleaning module (16). To this end, the wafer handling robotics device (34) is moveably mounted on a pair of 316L stainless steel rods (38). The control to traverse the wafer handling robotics device is custom software designed for robotic motion control. The wafer (32) is transported in the Vertical Plane to minimize the exposure of its surface to ambient contamination. A drip tray (39) connected to drain pipe (41), underlies the external wafer path of travel and collects any water drips therefrom. When the wafer handling robotics device (34) arrives at its programmed process position opposite the high pressure cleaning module (16) and verified, a cover (not shown) for opening (40) in the front of module (16) enclosure is pneumatically opened by a signal from the wafer handling robotics device (34) and arm (36) extends into the module (16) to position wafer (32) vertically therein in an edge gripping motor driven V-groove roller clamp assembly generally indicated by the numeral (42). The clamp assembly includes a pair of back V-grooved rollers (44) fixedly located and a pair of front V-grooved rollers (46) which are moved to a wafer engaging position upon the verification of a laser sensor (not shown) detecting placement of the wafer in the clamping position against the back V-grooved rollers (44). This sensing also signals the wafer handling robotics device (34) to release the wafer (32) from its pads (38) and retract its arm (36) into its resting position opposite module (16). When retracting is verified and the resting position has been verified the cover will close and the lower back V-grooved rollers (44) will be motor driven at a programmed process speed. Two arms (48) FIG. 4, one on each side of the wafer (32) and carrying two high pressure nozzles (50) are then traversed across the surface of the wafer (32) from edge to edge to give full high pressure deionized water cleaning to the wafer. At the same time, two ultrasonic spray nozzles (not shown) are fixedly located above the wafer (32) and will rinse the wafer from the top edge with ultrasonic pulses and wash away the particulate lifted by the high pressure spray.

The V-grooved rollers (44) and (46) are manufactured of polyurethane, shore 80A. The deionized water high pressure sprays are from 110 degree fan nozzles (50) for entire 200 mm wafer coverage. All fluid lines are of Teflon and also incorporate a point of use continuous drip (not shown) to eliminate any standing water within the lines thereby eliminating bacterial growth. All machined parts with the high pressure cleaning module (16) are beveled on a downward plane along with the bottom of the module itself, so that there will be no standing water within the module. The module has the water drain S-trapped (not shown) and connected to the main drain. The sweep speed at the time of the high pressure cleaning nozzles (50) are programmable by the process engineer. The high pressure is created by a pump (54 FIG. 4) manufactured in a Class 100 environment and containing Teflon non-contaminating seals. The high pressure tubing (56) which goes from the pump to the high pressures nozzles (50) is braided stainless steel with a thick wall Teflon core, it has a burst pressure rating of 10,000 psi. The pump is housed separately within the system to reduce the effect of the vibration which the pump creates when it is actively driving the water. It is mounted on air cushions to further reduce the vibration effect for particle generation.

After the process programs predetermined time has expired, the speed of the rollers (44) and (46) is increased up to the maximum of 300 rpm while the ultrasonic nozzles continue to rinse completely the wafer before it is transported to the spin/dry module (18). After the process program time has expired all water is turned off and the cover is opened. Upon sensor verification that the door has opened, the wafer handling robotics device (34) will extend its arm (36) into module (16). When the arm (36) extension sensor and the pad (38) sensor are verified, the roller clamp (42) will open to release the wafer. The wafer handling robotics device (34) will retract its arm (36) with the wafer from the module (16) and traverse to a position opposite the spin/dry module (18).

Figure 5:
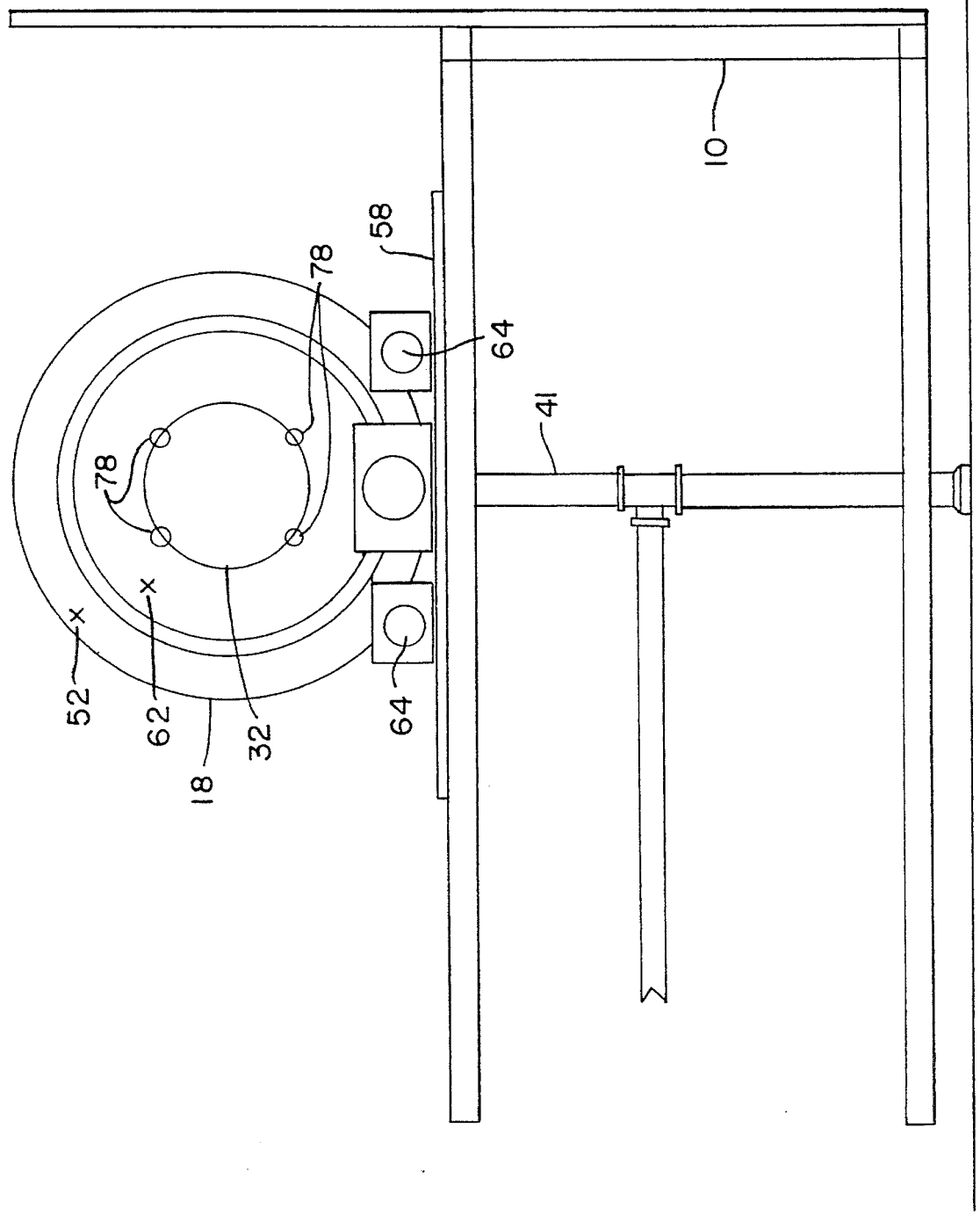
FIG. 5 is a sectional view taken along the line number 5 of FIG. 1 and showing details of the spin/dry module.
Figure 6:
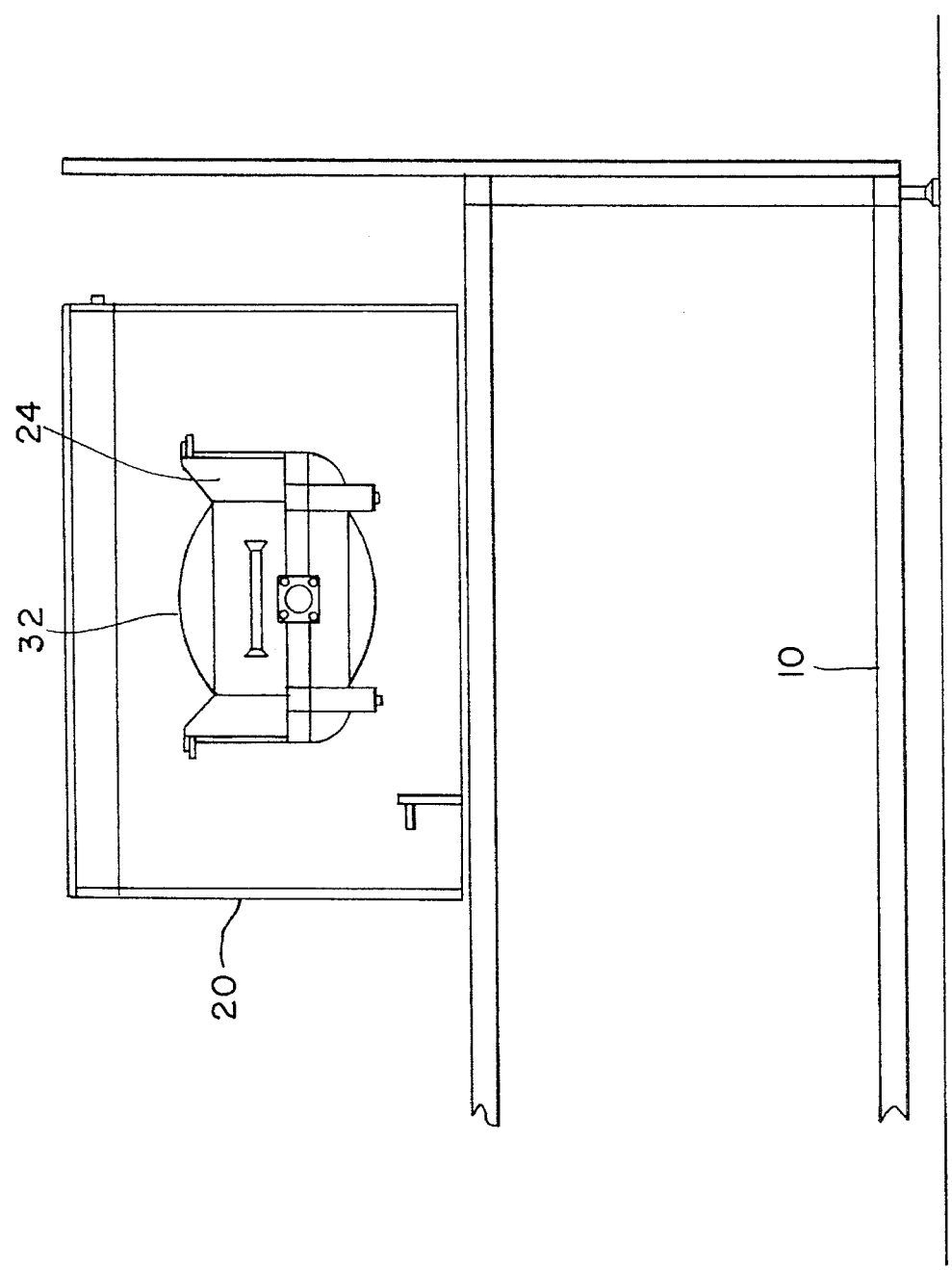
FIG. 6 is a sectional view taken along the line number 6 of FIG. 1 and showing details of the wafer unload module.

The spin/dry module (18) FIG. 5, includes a flat base (58) and two cylindrical portions (60) and (62) defining a Quartz or Lexan shroud of which portion (62) is axially movable to open the shroud and permit the insertion of a vertically supported wafer (32). Two rods (64) support the right-hand portion for sliding movement when a motor-driven lead screw (66 FIG. 1) reacting between a nut (68) fixed to the base and a socket fixed to the right-hand shroud portion (62) is rotated. The shroud will normally be open after a wafer has been removed.

Inside the shroud an edge holding clamp is mounted on a motor driven spindle (74 FIG. 2). The edge holding clamp consists essentially of four Teflon L-shaped arms (76 FIG. 2) extending outwardly from the spindle (74) and having inturned V-grooved ends (78) receiving a wafer there between. The shroud also mounts an exhaust ring (80) to ensure that all atomized water and lifted contaminants are pulled away from the wafer.

After the wafer handling robotics device (34) has removed to wafer (32) from the high pressure control module (16) it will traverse to its process position at the spin/dry module (18) and place the wafer within the edge holding clamp on the spindle (74). An edge holding clamp sensor (not shown) verifies the placement and causes the edge holding clamp to grasp the wafer in its arms inturned grooved ends (78) and the wafer handling robotics device (34) to release the wafer and move back to its resting position opposite the module (18). Once verification occurs the shroud cover is closed by actuating the screw motor; the shroud cover sensor (not shown) detects it and causes the spindle (74) motor to turn, at programmable process speed and for a programmable process time which the process engineer has decided appropriate for his/her process parameters.

The shrouds ringed exhaust (80) within its walls prevents any residual water from vaporizing and returning to the wafer surface. The spindle (74) is manufactured from high purity 316L stainless steel. The entire spindle is balanced to prevent any vibration from being created and reaching the high speed spinning wafer.

The shroud will also have a nitrogen blanket built in. Introduced nitrogen gas will have an ion charge, this ion charge will eliminate particulate from becoming attracted to the wafer surface. The nitrogen blanket will act as a positive/negative pressure desiccator when the shroud is sealed.

When the programmed process has been completed, the spindle motor will stop and lock the spindle (74) in position. When an optical sensor (not shown) has verified this, it will actuate the motor for screw (66) to open the shroud, and a second wafer handling robotic device (82) similar to the first (34) but with different programming and data, will extend its arm into the shroud and trigger the extension sensor. Once that sensor and the pad sensor have been verified, the spindle clamp will release the wafer. The wafer handling robotics device (82) will then take the wafer to the unload module (20).

The wafer is processed within the spin/dry module in a vertically positioned plane, including during high speed spin dry. The high speed spindle motor is capable of speeds in excess of 5000 rpm.

When the second wafer handling robotic device (82) reaches its programmed destination opposite the unload module (20), it will deposit the wafer (32) into the unload cassette (not shown) in the module (20). When the wafer handling robotics device extension arm sensor has been verified the robot (82) will release the wafer and return to its resting position. The unload module (20) is identical to the load module (14) with the exception of the water nozzles (28). Thus the module (20) has all of the same functions except for the wetting. All of the sensors operate in the same manner and are all verified for the same logic states to occur before the wafer handling robotics device performs its next function.

After the first wafer handling robotics device (34) deposited wafer (32) in the spin/dry module (18), it returned to the load module (14), removed the next indexed wafer therefrom and placed it in the high pressure cleaning module (16) and returned to its resting position opposite the module (16) to wait for the end of the module (16) cycle. It then carries the wafer to the spin/dry module (18). This overall cycle of load module (14), high pressure cleaning cycle module (16) and spin/dry cycle module (18) is repeated by the first wafer handling robotic device until the load cassette is empty of wafers, at which time the wafer handling robotics device will be returned to its home position. The load module (14) water is then turned off and the empty cassette moved and replaced with another cassette full of wafers that is then tilted. By tilting the cassette, residual water and particulate is prevented from staying in the cassette. This reduces algae, bacteria and particulate from transferring back to the wafer surface. All fluid lines are of Teflon and have a point-of-use 0.22 micron filter and metered by-pass valve so that there will be a constant flow of water and the lines never are left standing so as to have algae or bacterial growth within their walls. This reduces and controls contamination from a water source.

The electronic enclosure (not shown) contains all of the printed circuit boards which are used to control the system. This includes a Central Processing Unit with battery retention backup. The DAC boards, all motor controller circuitry and opto isolators are housed within this enclosure, as well as all power supplies, 5 vdc, 12 vdc, 24 vdc, and 48 vdc. These power supplies are each independent. All fuses and circuit breakers are located within the enclosure. There will be feeds taken from the incoming power to run the outside computer and robotic controller (both not shown).

The system has two EMO (emergency machine off) switches which are located at either end of the system. There is also a machine On switch, a Start switch, a Stop switch, and an Off switch which will be panel mounted on the front of the system.

The system can either be controlled by the panel switches or the computer. All circuit boards can be extended from the electronic enclosure for ease of troubleshooting and maintenance.

The processing unit has individual panels constructed from high polished 316L stainless steel. These panels can be removed from the unit for ease of unit maintenance.

All pneumatic and liquid lines are Teflon, market with the gas or fluid they contain and the direction of flow. They have color coded quick disconnects at the bulkhead fittings where they input to the system. They run to a Teflon manifold the Teflon valve plate assembly which is on a slide tray for ease of adjustment and maintenance.

It will be appreciated that the applicant has invented a new and useful assembly line multistation type semiconductor wafer cleaner and process, one particularly adapted for large wafers that will bear high circuit densities requiring that all particulate down to 0.3 micron diameters be removed from useful chips cut therefrom. Applicant's ingenious use of technology enabling the treatment of the wafer in a vertical or upright condition, allows the loosened particulate all to be removed, that is, with none of the particulate falling back to the surface of the wafer as is frequently the case with wafers being cleaned in the horizontal position. Applicant's unique means for rotatably mounting the wafer in the high pressure cleaning module and for subjecting the wafer to both high pressure and ultrasonic flows of deionized water results in total cleaning of all particulate down to a 0.3 micron size and lower from the wafer without damaging it. Applicant's unique spin/dry module not only removes the moisture from the wafer by centrifugal force, but also by a shroud ring or peripheral capture exhaust insures removal of essentially all water and hence precludes any residual water in the module turning to mist or fog and returning to the water surface.

While applicant has set forth a preferred embodiment of the invention, it will be apparent to those skilled in the art that other and different embodiments may be designed utilizing principles of the invention. It is intended therefore to be limited only by the scope of spirit of the following claims.

I claim:

1. A semiconductor wafer high purity cleaning apparatus comprising successively arranged wafer loading, cleaning, drying and unloading modules each having an individual closable enclosure to help prevent contamination of wafers located within each enclosure when it is closed;

means for storing a plurality of wafers in a vertical plane within the closed enclosures of said loading and unloading modules;

means for transporting a sequence of individual wafers between the enclosures of said loading module, cleaning module, drying module and unloading module while continually maintaining each wafer in a vertical plane;

means for rotating the wafer in a vertical plane while it is located within the closed enclosure of said cleaning module; and high pressure jet means for simultaneously cleaning opposite surfaces of the wafer with streams of high pressure deionized water while the wafer is rotating.

2. The semiconductor wafer cleaning apparatus of claim 1 also comprising ultrasonic spray nozzles above said rotating wafer to supply ultrasonic pulses of deionized water to rinse away any particulate lifted by said high pressure streams of deionized water.

3. The semiconductor wafer cleaning apparatus of claim 1 also comprising means for moving said jet means to cause said high pressure water streams to traverse the entire opposite surfaces of said rotating wafer.

4. The semiconductor wafer cleaning apparatus of claim 1 wherein said transporting means comprises a first robotics means for transporting said individual wafers between the enclosures of said loading module, cleaning module and drying module, and a second robotics means for transporting said individual wafers between the enclosures of said drying module and said unloading module.

5. The semiconductor wafer cleaning apparatus of claim 1 also comprising means for pre-rinsing the wafers stored within the enclosures of said loading module to help reduce contamination of the wafers by their wet condition during transportation to the cleaning module.

6. The semiconductor wafer cleaning apparatus of claim 5 wherein said wafer storing means comprises a cassette, and said loading module also comprises means for tilting said cassette in a vertical plane to help prevent residual water from remaining in said cassette.

7. The semiconductor wafer cleaning apparatus of claim 1 also comprising means for rotating said wafer at high speed in a vertical plane while it is enclosed within the enclosure of said drying module, and means for exhausting water emanating from said rotating drying wafer, said water exhausting means at least partially surrounding said rotating wafer.

8. The semiconductor wafer cleaning apparatus of claim 7 wherein said enclosure of said drying module comprises two cylindrical shroud portions axially movable relative to one another to open and close said enclosure.

9. The semiconductor wafer cleaning apparatus of claim 8 wherein said shroud portions also comprise said water exhausting means.

10. The semiconductor wafer cleaning apparatus of claim 7 also comprising means for introducing a blanket of ionized Nitrogen gas within the enclosure of said drying module while said wafer is rotating therein.

11. The method of cleaning semiconductor wafers to near absolute purity comprising the steps of:

storing and rinsing a plurality of wafers in spaced relation alongside one another in a vertical plane within a loading enclosure;

transporting a sequence of individual wafers from the loading enclosure to a separate cleaning enclosure while the wafer is still wet and maintained in a vertical plane;

rotating the wafer in a vertical plane within the cleaning enclosure; and simultaneously washing and rinsing opposite surfaces of the rotating wafer by a combination of high pressure streams and ultrasonic spray pulses of deionized water.

12. The semiconductor wafer cleaning method of claim 11 comprising the additional steps of transporting the cleaned wafer from the cleaning enclosure to a separate drying enclosure while the wafer is still wet and maintained in a vertical plane, supplying a nitrogen gas blanket to the drying enclosure, rotating the wafer at high speed in a vertical plane within the enclosure, and peripherally exhausting water emanating from the rotating wafer from the drying enclosure.

* * * * *